(12) United States Patent
Lin

(10) Patent No.: US 9,583,600 B1
(45) Date of Patent: Feb. 28, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventor: Chien-Ting Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/877,950

(22) Filed: Oct. 8, 2015

(51) Int. Cl.

| | |
|---|---|
| *H01L 29/78* | (2006.01) |
| *H01L 29/66* | (2006.01) |
| *H01L 29/06* | (2006.01) |
| *H01L 21/283* | (2006.01) |
| *H01L 21/311* | (2006.01) |
| *H01L 29/423* | (2006.01) |
| *H01L 21/3213* | (2006.01) |

(52) U.S. Cl.
CPC ......... *H01L 29/6681* (2013.01); *H01L 21/283* (2013.01); *H01L 21/31105* (2013.01); *H01L 21/32131* (2013.01); *H01L 29/0649* (2013.01); *H01L 29/42356* (2013.01); *H01L 29/785* (2013.01)

(58) Field of Classification Search
CPC ............... H01L 29/6681; H01L 29/785; H01L 29/7831; H01L 29/66795; H01L 21/815; H01L 21/283; H01L 29/0649; H01L 21/31105; H01L 21/32131; H01L 29/42356; H01L 29/7855; H01L 29/7856
See application file for complete search history.

(56) References Cited

U.S. PATENT DOCUMENTS

| | | | |
|---|---|---|---|
| 8,455,330 B2 * | 6/2013 | Anderson | ......... H01L 21/76283 257/368 |
| 2013/0187237 A1 | 7/2013 | Yu et al. | |
| 2014/0027820 A1 | 1/2014 | Aquilino et al. | |
| 2015/0311343 A1 * | 10/2015 | Chowdhury | ........ H01L 29/7851 257/401 |
| 2016/0056181 A1 * | 2/2016 | Anderson | ........... H01L 27/1211 257/347 |

* cited by examiner

*Primary Examiner* — Jose R Diaz
(74) *Attorney, Agent, or Firm* — Winston Hsu; Scott Margo

(57) ABSTRACT

A method for fabricating semiconductor device is disclosed. The method includes the steps of: providing a substrate having a fin-shaped structure thereon and shallow trench isolation (STI) around the fin-shaped structure; forming a gate line across the fin-shaped structure and on the STI; performing a first cutting process to remove the part of the gate line directly above the fin-shaped structure and the fin-shaped structure directly under the gate line; and performing a second cutting process to remove part of the gate line on the STI.

4 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of conducting two cutting process to form gate trenches within a gate line after replacement metal gate (RMG) process.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, gate lines formed between adjacent fin-shaped structures have the tendency to be tangled due to smaller pitch. The entanglement of the gate lines, and more particularly the uneven thickness of the work function metal layer within the gate line typically results in instability of Vt of the device. Hence, how to resolve the issue has become an important task in this field.

SUMMARY OF THE INVENTION

According to a preferred embodiment of the present invention, a method for fabricating semiconductor device is disclosed. The method includes the steps of: providing a substrate having a fin-shaped structure thereon and shallow trench isolation (STI) around the fin-shaped structure; forming a gate line across the fin-shaped structure and on the STI; performing a first cutting process to remove the part of the gate line directly above the fin-shaped structure and the fin-shaped structure directly under the gate line; and performing a second cutting process to remove part of the gate line on the STI.

According to another aspect of the present invention, a semiconductor device is disclosed. The semiconductor device includes: a substrate having a fin-shaped structure thereon and a shallow trench isolation (STI) around the fin-shaped structure; and a gate line on the STI and adjacent to the fin-shaped structure, in which the gate line comprises a L-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
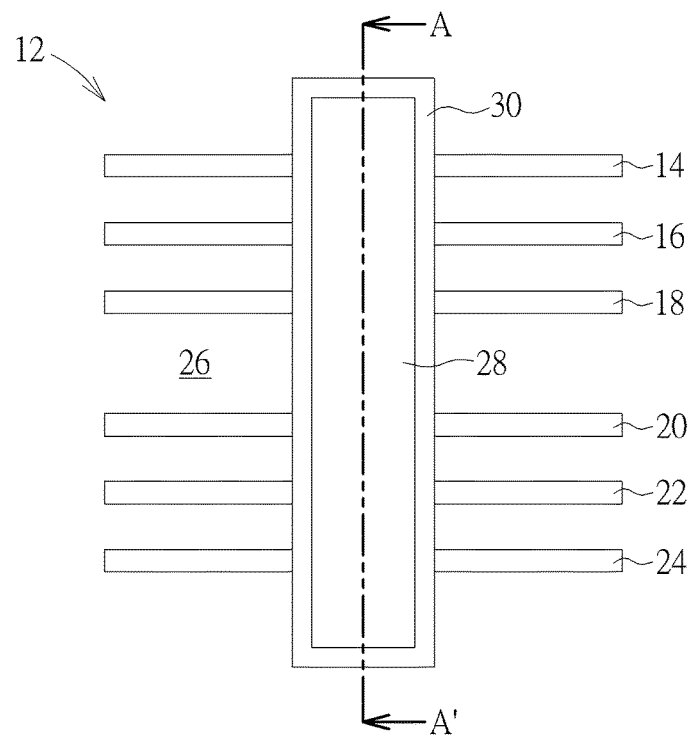
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12 is first provided, a plurality of fin-shaped structures 14, 16, 18, 20, 22, 24 are formed on the substrate 12, a shallow trench isolation (STI) 26 is formed around the fin-shaped structures 14, 16, 18, 20, 22, 24 and a gate line 28 is formed across the fin-shaped structures 14, 16, 18, 20, 22, 24 and on the STI 26. The substrate 12 could be a silicon substrate, a silicon-containing substrate (such as SiC substrate), a GaN substrate, a GaN-on-silicon substrate, a graphene-on-silicon substrate, a SOI substrate or a substrate containing epitaxial layer (such as a p-type substrate containing p-type epitaxial layer with 2.5 μm thickness). The STI 26 could be composed of insulating material such as silicon oxide, but not limited thereto. It should be noted that even though multiple fin-shaped structures 14, 16, 18, 20, 22, 24 and a single gate line 28 are provided in this embodiment, the quantity of the fin-shaped structures 14, 16, 18, 20, 22, 24 and gate line 28 could all be adjusted according to the demand of the product, which is also within the scope of the present invention.

The formation of the fin-shaped structures 14, 16, 18, 20, 22, 24 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structures 14, 16, 18, 20, 22, 24. Alternatively, the formation of the fin-shaped structures 14, 16, 18, 20, 22, 24 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 14, 16, 18, 20, 22, 24. In another fashion, the patterned hard mask could be removed selectively or retained, and deposition, CMP, and then etching back could be used to form a STI surrounding the bottom of the fin-shaped structures 14, 16, 18, 20, 22, 24. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

Figure 2:
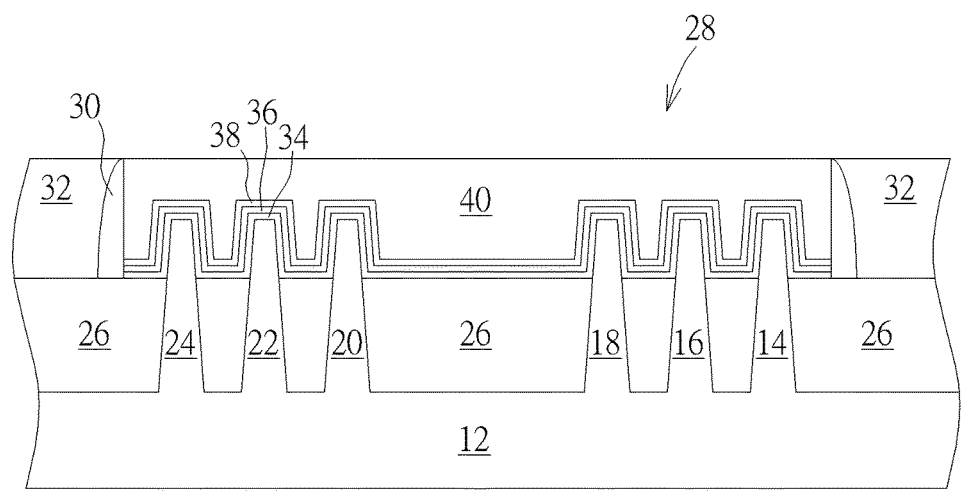

Referring to FIG. 2, which further illustrates a cross-sectional view of the gate line 18 along sectional lines AA' of FIG. 1. The fabrication of the gate line 28 could be accomplished by a gate first process, a high-k first approach from gate last process, or a high-k last approach from gate last process. Since this embodiment pertains to a high-k last approach, a dummy gate line (not shown) composed of interfacial layer and polysilicon material could be first formed on the substrate 12, and a spacer 30 is formed on the sidewall of the dummy gate line. Next, a source/drain region (not shown) and/or epitaxial layer (not shown) are then formed in the substrate 12 adjacent to two sides of the spacer 30, a silicide layer (not shown) could be selectively formed on the source/drain region and/or epitaxial layer, and an interlayer dielectric (ILD) layer 32 composed of material such as tetraethyl orthosilicate (TEOS) is formed on the dummy gate line.

Next, a replacement metal gate (RMG) process could be conducted to first planarize part of the ILD layer 32 and then transform the dummy gate line into metal gate line. The RMG process could be accomplished by first performing a selective dry etching or wet etching process, such as using etchants including ammonium hydroxide ($NH_4OH$) or tetramethylammonium hydroxide (TMAH) to remove the polysilicon material from dummy gate line for forming a recess (not shown) in the ILD layer 32 and spacer 30.

Next, the interfacial layer in the dummy gate line could be removed, and another interfacial layer (not shown), a high-k dielectric layer 34, a bottom barrier metal (BBM) layer 36, a work function metal layer 38, and a low resistance metal layer 40 are deposited into the recess. A planarizing process, such as CMP process is then conducted so that the top surfaces of the low resistance metal layer 40 and ILD layer 32 are coplanar.

In this embodiment, the interfacial layer is preferably composed of oxides such as $SiO_2$, SiN, or SiON, but could also be composed of high-k dielectric material. The BBM layer 36 is selected from the material consisting of TiN and TaN, but not limited thereto.

The high-k dielectric layer 34 is preferably selected from dielectric materials having dielectric constant (k value) larger than 4. For instance, the high-k dielectric layer 34 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the metal gate line to be appropriate in an NMOS or a PMOS. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof. Since the process of using RMG process to transform dummy gate line into metal gate line is well known to those skilled in the art, the details of which are not explained herein for the sake of brevity.

Figure 3:
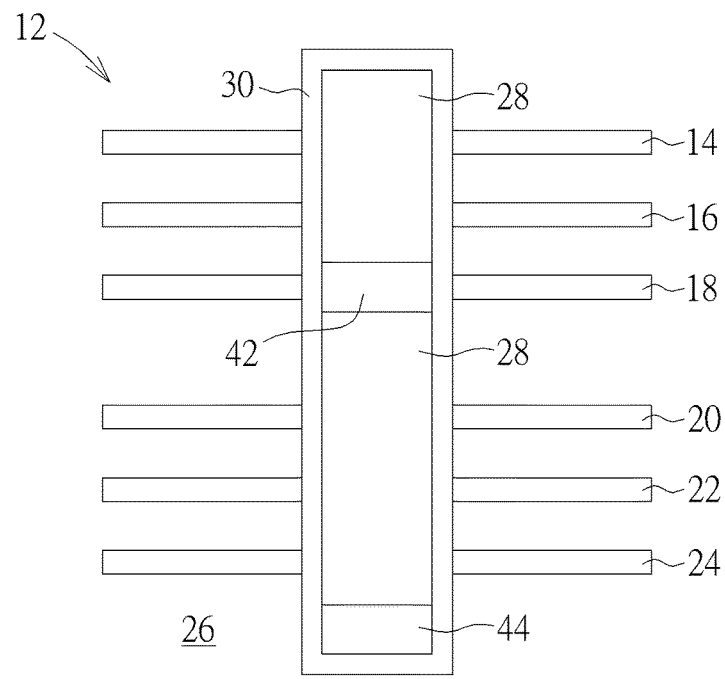

Next, as shown in FIG. 3, a first cutting process is conducted to remove the part of the gate line 28 directly above the fin-shaped structure 18 as well as the fin-shaped structure 18 directly under the gate line 28, and a second cutting process is conducted to remove part of the gate line 28 on the STI 26, in which the first cutting process and the second cutting process could be accomplished by an etching process of desirable choice. Preferably, the first cutting process and the second cutting process are conducted simultaneously to not only divide the gate line 28 into multiple segments but also separate the fin-shaped structure 18 into two parts.

More specifically, by removing part of the gate line 28 directly above the fin-shaped structure 18 along with the fin-shaped structure 18 directly under the gate line 28, the first cutting process forms a gate trench 42 surrounded by the spacer 30 and the rest of gate line 28. The second cutting process is accomplished by identical means as the first cutting process to remove part of gate line 28 on the STI 26, in which the portion of the gate line 28 being removed is relatively close to the end portion of the gate line 28. This forms another gate trench 44 on the STI 26, in which the gate trench 44 is surrounded by the spacer 30 at three sides and the rest of the gate line 28 on one side.

Figure 4:
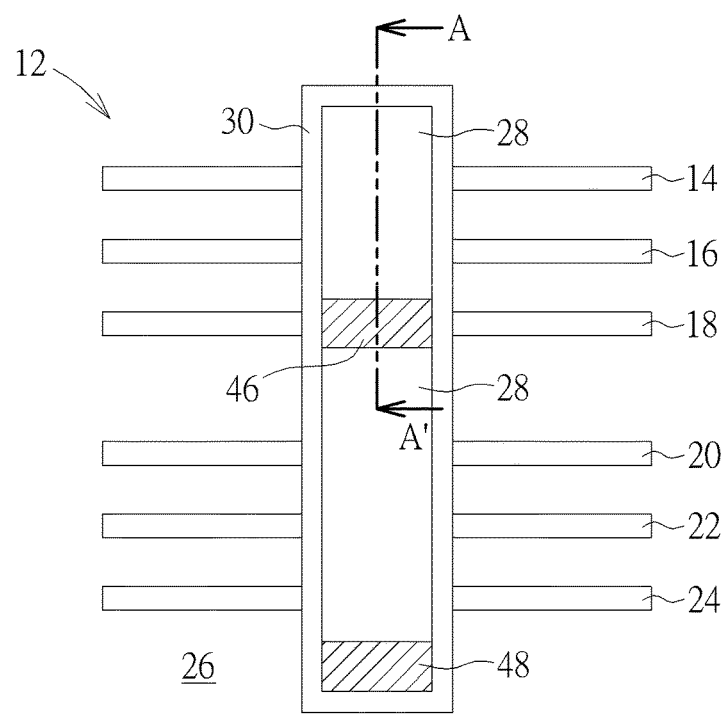

Next, as shown in FIG. 4, an insulating material is filled into the gate trench 42 and gate trench 44, and a planarizing process such as CMP is conducted to remove part of insulating material for forming a gate isolation 46 and a gate isolation 48. Preferably, the gate isolations 46 and 48 are surrounded by the spacer 30 and the rest of the gate line 28. The insulating material could be the same as or different from the material of the STI 26, and in this embodiment, the insulating material or the gate isolation 46 is preferably composed of silicon nitride, but not limited thereto. Next, typical FinFET fabrication process could be carried out to form additional dielectric layers on the ILD layer 32 and the gate line 28 and contact plugs electrically connecting the gate line 28. This completes the fabrication of a semiconductor device according to a preferred embodiment of the present invention.

Figure 5:
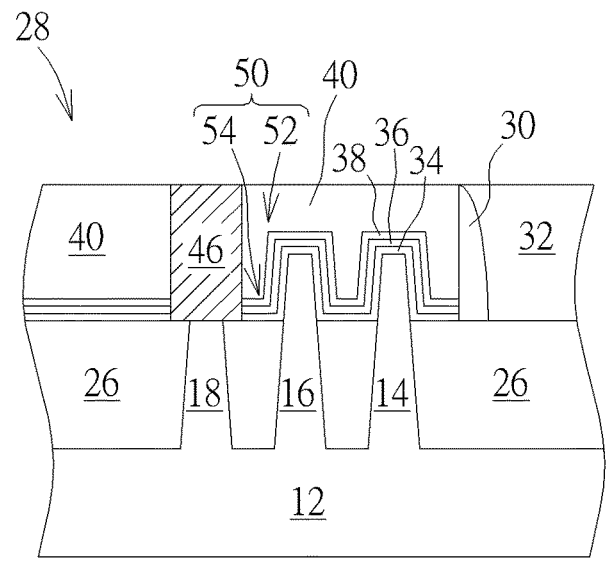

Referring to FIGS. 4-5, FIG. 5 illustrates a cross-sectional view of the gate line 28 along the sectional lines AA' of FIG. 4. As shown in FIGS. 4-5, the semiconductor device of the present invention preferably includes multiple fin-shaped structures 14, 16, 18, 20, 22, 24 on a substrate 12 and a STI 26 surrounding the fin-shaped structures 14, 16, 18, 20, 22, 24, a gate line 28 on the STI 26 and intersecting the fin-shaped structures 14, 16, 18, 20, 22, 24, and a ILD layer 32 on the substrate 12 and around the gate line 28.

Preferably, the gate line 28 is composed of a high-k dielectric layer 34, a BBM layer 36 on the high-k dielectric layer 34, a work function metal layer 38 on the BBM layer 36, and a low resistance metal layer 40 on the work function metal layer 38.

The gate line 28 is also divided into multiple segments with a gate isolation 46 between segmented gate lines 28 and a gate isolation 48 at the end of the gate line 28. The gate isolations 46 and 48 are composed of same material, while the material of the gate isolations 46 and 48 is different from the material of the ILD layer 32. In this embodiment, the gate isolations 46 and 48 are selected from the material consisting of SiN while the ILD layer 32 is composed of TEOS or $SiO_2$, but not limited thereto.

Figure 6:
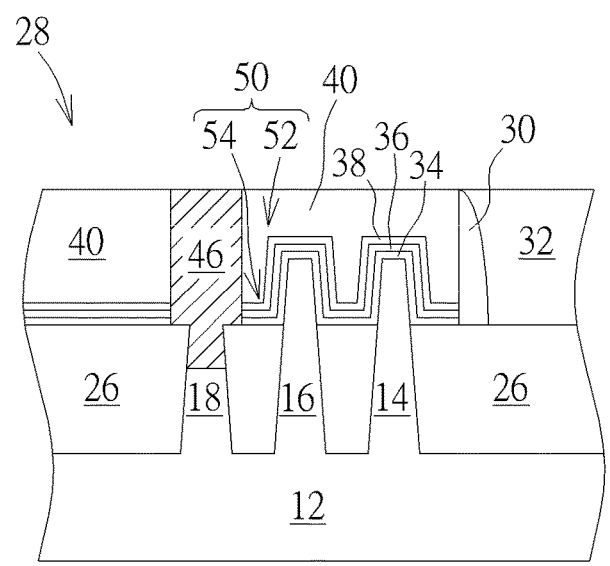
FIG. 6 illustrates a perspective view of a gate isolation according an embodiment of the present invention.

It should be noted that even though the bottom surface of the gate isolation 46 is completely even with the top surface of the fin-shaped structure 18 and STI 26, it would also be desirable to extend the depth of the gate isolation 46 slightly into the fin-shaped structure 18 as shown in FIG. 6 so that part of the gate isolation 46 is lower than the top surface of STI 26, which is also within the scope of the present invention.

As shown in FIG. 5, the gate line 28 further includes a L-shaped or reverse L-shaped structure 50 particularly formed between the fin-shaped structure 16 and the gate isolation 46. More specifically, the L-shaped structure 50 is composed of a vertical portion 52 and a horizontal portion 54, in which the vertical portion 52 contacts the fin-shaped structure 16 directly while the horizontal portion 54 contacts the gate isolation 46 and the STI 26.

Figure 7:
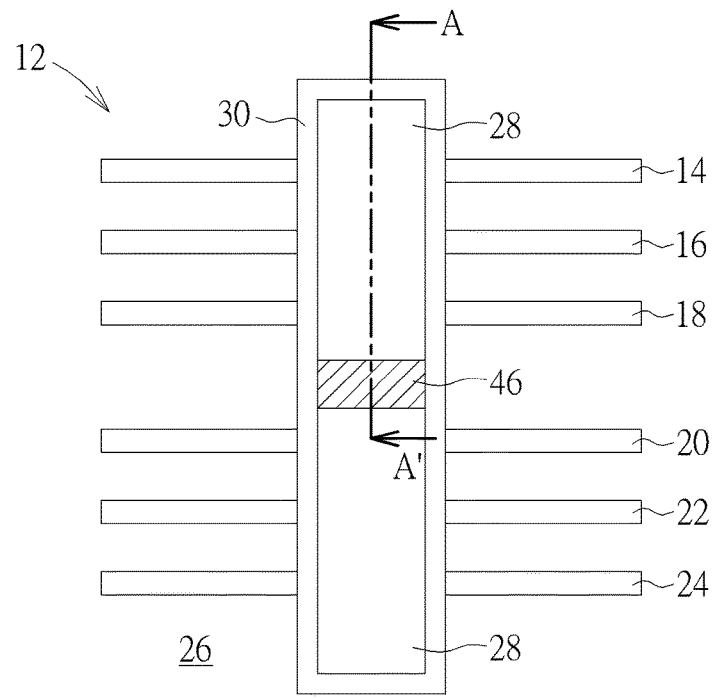
FIG. 7 illustrates a top view of a semiconductor device according to an embodiment of the present invention.
Figure 8:
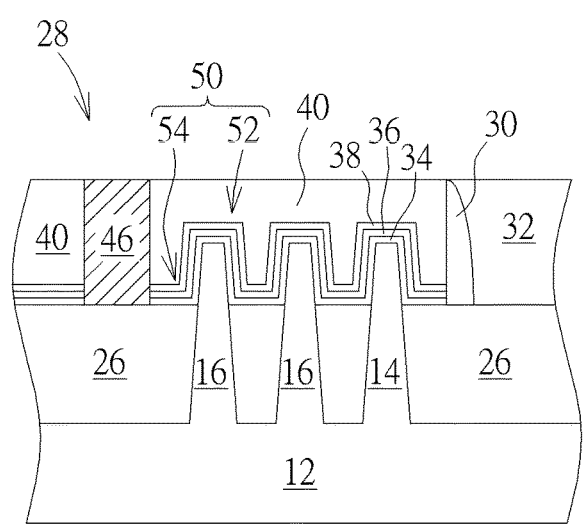
FIG. 8 illustrates a cross-sectional view of the gate line along the sectional line AA' of FIG. 7.

Referring to FIGS. 7-8, FIG. 7 illustrates a top view of a semiconductor device according to an embodiment of the present invention and FIG. 8 illustrates a cross-sectional view of the gate line 28 along the sectional line AA' of FIG. 7. As shown in FIG. 7, in contrast to the approach of forming gate isolation 46 directly above the fin-shaped structure 18 as shown in FIG. 4, it would be desirable to form a gate trench (not shown) between fin-shaped structures 18 and 20 and then fill the gate trench with insulating material such as silicon nitride. In this instance, as shown in FIG. 8, the gate isolation 46 would be formed atop STI 26 and having no fin-shaped structures underneath.

Overall, the present invention first forms a gate line preferably undergone RMG process across at least a fin-shaped structure on a substrate and then conducts a first cutting process to remove part of the gate line directly above the fin-shaped structure and the fin-shaped structure directly under the gate line for forming a first gate trench, and a second cutting process to remove part of the gate line on the STI for forming a second gate trench. The first gate trench and the second gate trench are then filled with insulating material to form a first gate isolation and a second gate isolation. It is to be noted that since part gate line was cut off during the aforementioned first cutting process and second cutting process, the remaining gate line would reveal a substantially L-shaped structure between the fin-shaped structure and the gate isolation. According to a preferred embodiment of the present invention, the L-shaped structure formed between fin-shaped structures and the gate isolation reveals a much more relaxed and smooth state of the gate line, which further indicates that the metals within the gate line, and most importantly the work function metal layer is not tangled with each other thereby having an even thickness. Ideally, the untangled state as well as even thickness of the work function layer as disclosed by the present invention ensures a stable Vt of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a fin-shaped structure thereon and shallow trench isolation (STI) around the fin-shaped structure;
    forming a gate line across the fin-shaped structure and on the STI;
    performing a first cutting process to remove the part of the gate line directly above the fin-shaped structure and the fin-shaped structure directly under the gate line; and
    performing a second cutting process to remove part of the gate line on the STI.

2. The method of claim 1, wherein the gate line comprises:
    a high-k dielectric layer;
    a work function metal layer on the high-k dielectric layer; and
    a low resistance metal layer on the work function layer.

3. The method of claim 1, further comprising performing the first cutting process and the second cutting process simultaneously.

4. The method of claim 1, further comprising:
    forming a first gate trench on the fin-shaped structure after performing the first cutting process and forming a second gate trench on the STI after forming the second cutting process; and
    filling an insulating material into the first gate trench and the second trench for forming a first gate isolation and a second gate isolation.

* * * * *